(12) United States Patent
Morinaga et al.

(10) Patent No.: US 6,903,906 B2
(45) Date of Patent: Jun. 7, 2005

(54) MAGNETIC HEAD WITH A LAMINATION STACK TO CONTROL THE MAGNETIC DOMAIN

(75) Inventors: Akira Morinaga, Odawara (JP); Koichi Nishioka, Hiratsuka (JP); Takayoshi Ohtsu, Oi (JP); Norifumi Miyamoto, Chigasaki (JP); Shuichi Kojima, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 197 days.

(21) Appl. No.: 10/219,647

(22) Filed: Aug. 14, 2002

(65) Prior Publication Data
US 2003/0189802 A1 Oct. 9, 2003

(30) Foreign Application Priority Data
Apr. 8, 2002  (JP) ........................................ 2002-104652

(51) Int. Cl.[7] ................................................. G11B 5/39
(52) U.S. Cl. ................................................. 360/324.12
(58) Field of Search ........................ 360/327.1, 327.32, 360/327.12, 324.12

(56) References Cited

U.S. PATENT DOCUMENTS

| 4,663,685 A | 5/1987 | Tsang |
| 5,018,037 A | 5/1991 | Krounbi et al. |
| 5,739,990 A | 4/1998 | Ravipati et al. |
| 6,266,218 B1 * | 7/2001 | Carey et al. ............ 360/324.12 |

FOREIGN PATENT DOCUMENTS

| JP | 3-125311 | 5/1991 |
| JP | 9-282618 | 10/1997 |
| JP | 11-53716 | 2/1999 |
| JP | 11-203634 | 7/1999 |
| JP | 2000-76625 | 3/2000 |
| JP | 2001-52315 | 2/2001 |
| JP | 2001-84527 | 3/2001 |

\* cited by examiner

*Primary Examiner*—A. J. Heinz
(74) *Attorney, Agent, or Firm*—Townsend and Townsend and Crew LLP

(57) ABSTRACT

The invention provides a magnetic domain controlling structure wherein a lamination stack M1 adjacent to a magnetoresistive stack of a GMR, CPP-GMR or TMR magnetic head has at least two magnetic films 14 and 16 anti-ferromagnetically coupled through a non-magnetic film 15, or the lamination stack M2 disposed on the end portions of the free layer of the magnetoresistive stack of the GMR magnetic head has a magnetic layer anti-ferromagnetically coupled to the free layer 2 through the non-magnetic film 27. Ferromagnetic film deposition dead zone area problems and the consequent problem of film rippling in free layer portions that reduces element sensitivity are prevented, as is the problem of increased error from read drift in the magnetic field exchange coupling method, resulting in a highly stable, highly sensitive MR head with no loss of magnetic field intensity.

12 Claims, 15 Drawing Sheets

MAGNETIC HEAD WITH A LAMINATION STACK TO CONTROL THE MAGNETIC DOMAIN

STATEMENT AS TO RIGHTS TO INVENTIONS MADE UNDER FEDERALLY SPONSORED RESEARCH OR DEVELOPMENT

Not Applicable

CROSS-REFERENCES TO RELATED APPLICATIONS

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

This invention relates to magnetoresistive heads using the magnetoresistive effect by which information is reproduced from a magnetic recording medium, and magnetic heads by which recording and reproduction are carried out.

A magnetic head in a hard disk drive (HDD) provides the recording head which records information on a magnetic recording medium (hard disk) as magnetized signals and a reproducing head which reads the information recorded on the magnetic recording medium. The reproducing head is a magnetoresistive stack which comprises multiple magnetic thin films and non-magnetic thin films, and is referred to as a magnetoresistive (MR) head because signals are read out by use of the magnetoresistive effect. There are several types of stack structures for MR heads and they are classified, according to the principle of magnetoresistance used therein, into AMR (Anisotropy Magnetoresistive) heads, GMR (Giant Magnetoresistive) heads, CPP-GMR (Current Perpendicular Plane-GMR) heads, and TMR (Tunnel Magnetoresistive) heads. The magnetic head utilizes the AMR effect, GMR effect, CPP-GMR effect, and TMR effect, respectively, to read magnetic fields input on the magnetic recording medium and which, when they enter the magnetic head, change the voltage of electric current in the magnetic head.

When one magnetic layer in the magnetoresistive stack of an MR head is a free layer whose magnetic orientation is rotated upon receiving an external magnetic field from a magnetic recording medium, and that free layer has multiple magnetic domains, movement of magnetic domain walls occurs, causing noise. To suppress various noises such as Barkhausen noise, or to control asymmetry of the output signal, it is important to make the free layer have a single magnetic domain, widthwise, in the track.

In a method for controlling magnetic domains to make a free layer have a single magnetic domain, for example, as shown in Japanese Patent Laid-Open No. 125311/1993 and FIG. 9, there is a magnetoresistive stack which comprises an anti-ferromagnetic film 5, a soft magnetic film 4 (referred to as a pinned layer), a non-magnetic layer 3, a free layer 2 and a cap layer 1. A laminated stack having a seed film 9 and a ferromagnetic film 8 is disposed with a lead 6 thereon through another seed film 7 so that it is adjacent to each layer of the magnetoresistive stack. This method, which uses a magnetic field generated from magnetic film 8 widthwise in the track, is called hard bias.

In another representative method for controlling magnetic domains, as shown in U.S. Pat. No. 4,663,685 and FIG. 10, there is a magnetoresistive stack which comprises an anti-ferromagnetic film 5, soft magnetic film 4 (referred to as a pinned layer), a non-magnetic layer 3, a free layer 2 and a cap layer. In a method called patterned exchange, a lead layer 10 is formed on both ends of free layer 1 in such a manner that a seed film 11 is sandwiched between lead layer 10 and an anti-ferromagnetic film 12, and exchange coupling between anti-ferromagnetic film 12 and free layer 5 takes place.

Further, as proposed, for example, by Japanese Patent Laid-Open No. 282618/1997, Japanese Patent Laid-Open No. 53716/1999 or U.S. Pat. No. 5,739,990 is a system in which, to realize high reproducing output, a dead zone area, not to be used for reading, is created at the end portions of the free layer in the track in a widthwise direction by making the distance between the leads smaller than the track width of the free layer, since the magnetic orientation of the free layer is made difficult to rotate by the intensity of the magnetic fields generated by the lamination. Furthermore, as shown in Japanese Patent Laid-Open No. 203634/1999, there is a method in which an anti-ferromagnetic film of uniform thickness is built up on the entire surface of the free layer.

Moreover, as shown in Japanese Patent Laid-Open No. 2001-84527, also proposed is a system in which a magnetic domain control film comprises a high coercivity film and a lamination of a ferromagnetic film or an anti-ferromagnetic film or both.

However, in a magnetic domain control system as shown in FIG. 9, in which lamination layers having ferromagnetic film are disposed at both sides of the free layer, the dead zone area is increased when the ferromagnetic film is made thicker to secure stability of the element. To reduce the dead zone area, magnetic domain control force may be weakened by a method in which the thickness of the ferromagnetic film is simply reduced. In such case, however, drawbacks occur, such as Barkhausen noise and waveform instability, or increase of output asymmetry. It therefore becomes necessary to have magnetic domain control force so as not to generate those problems.

In addition to the problems relating to the dead zone area, it becomes a significant problem that the ferromagnetic film is overlaid on an upper surface of the element. The overlaid portion of the magnetic film generates a magnetic field in the opposite direction to the magnetic domain control magnetic field, and in the magnetic domain controlling magnetic field distribution across the track width (Twr) direction of free layer 2 shown in FIG. 12, rippling occurs in the vicinity of a portion in which magnetic film 8 is disposed, at end portions of free layer 2 in the track width (Twr) direction. Together with this rippling, the magnetic field which is applied to the end portion areas of free layer 2 in the track width direction is decreased. As a result, instability of the element is increased. In addition, to suppress the instability, magnetic film 8 must be made thicker than necessary, and, as a result, a magnetic field stronger than necessary is applied over the entire free layer 2 so that sensitivity is damaged. It is difficult to eliminate the overlay of magnetic film 8 completely due to the process employed. Thus it is necessary to use ingenuity with regard to the magnetic domain control structure.

In contrast, in a magnetic domain control method in which the anti-ferromagnetic film is disposed as shown in FIG. 10, coupling a magnetic field affects only the portion at which the anti-ferromagnetic film 12 is in contact with the free layer 2; therefore, the dead zone problem does not occur, and this method is also advantageous in making narrower tracks. Further, there is no effect of the overlay of the magnetic film on the element. However, the exchange coupling magnetic field of anti-ferromagnetic film 12 and free layer 2 is smaller as compared with a case in which magnetic film 8 is used.

As shown in FIG. 12, it is preferred that a magnetic field does not exist in a magnetic sensing region, but the magnetic field intensity is extremely small compared with the magnetic field of the end portions in the track width (Twr) direction of free layer 2 in a case where magnetic film 8 is used. Further, when an apparatus such as HDD (hard disk drive)is in use, the exchange magnetic field of anti-ferromagnetic film 12 and the end portion of free layer 2 deteriorates due to heat generated by the magnetoresistive element, and the magnetic domain controlling magnetic field is further decreased. Therefore, the problem arises that the end portion area of the free layer 2, which should be fixed, has sensitivity, and read drift occurs so that the record data of an adjacent track is read and the error rate is increased. Further, there a process problem that, because the width Tw of the magnetic sensing region increases as the effective track width is broadened, the geometric track width Twr must be made smaller.

In addition, the method disclosed in Japanese Patent Laid-Open No. 282618/1997, Japanese Patent Laid-Open No. 53716/1999 or U.S. Pat. No. 5,739,990 reduces the effect on reproducing output due to the dead zone problem, but due to the weakness of the magnetic domain controlling force which is applied to the end portions widthwise in the track of the free layer disposed under the lead, read drift becomes a significant problem: side read and crosstalk deteriorate, and the effective track width is broadened. Further, in regard to a magnetic head shown in Japanese Patent Laid-Open No. 203634/1999, there is a concern that, since the present head has a very narrow track width, fixing the entire surface of the free layer to be a uniform magnetic field results in lowered sensitivity, and adversely results in the absence of a magnetic domain controlling magnetic field at the end portions of the free layer, widthwise in the track where magnetic domain control is particularly necessary.

Moreover, a magnetic head shown in Japanese Patent Laid-Open No. 84527/2001 does not have enough coupling force since the anti-ferromagnetic film and the high coercivity film are coupled directly or through the ferromagnetic film.

BRIEF SUMMARY OF THE INVENTION

This invention provides a magnetoresistive head and a magnetic head which have greater sensitivity and higher stability compared to related art structures having the magnetic domain controlling film with a narrowed track, but maintain the same magnetic field intensity. This invention enables a GMR, CPP-GMR or TMR head and is of a magnetic domain controlling structure in which the laminated stack adjacent to a magnetoresistive stack has at least two magnetic films coupled anti-ferromagnetically through a non-magnetic film. Alternatively, it provides a GMR head operating according to a magnetic domain controlling method using the exchange coupling magnetic field of an anti-ferromagnetic film and a free layer. It also provides a magnetic domain controlling structure in which a laminated stack disposed on the end portion areas of the free layer of the magnetoresistive stack has a magnetic film which is anti-ferromagnetically coupled to the free layer through a non-magnetic film.

The structure of the invention is different from the structure of the related art. The invention can solve problems such as read drift and increase of effective track width by use of anti-ferromagnetic coupling through non-magnetic coupling whose coupling force is far greater than that available in the existing art.

DESCRIPTION OF THE PREFERRED EMBODIMENTS

Preferred embodiments of a magnetic domain controlling system in a magnetoresistive head (MR head) according to the present invention will be described with reference to the drawings.

Figure 1:
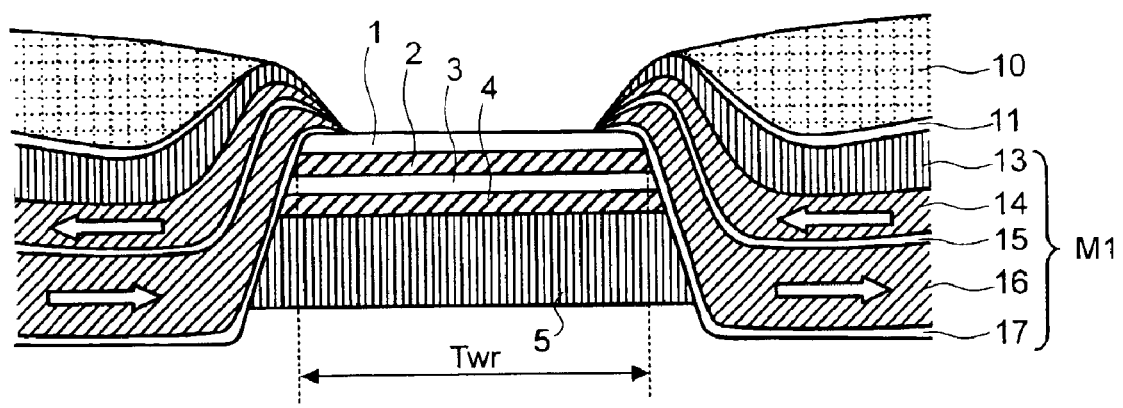
FIG. 1 is a cross-sectional view of a GMR magnetoresistive element according to a first embodiment of the invention.

FIG. 1 is a cross-sectional view of a GMR element according to one embodiment of the invention. First, magnetic orientation of a pinned layer 4 is fixed by an anti-ferromagnetic body 5. On pinned layer 4, is disposed a non-magnetic layer 3 which is made of, for example, Cu, having a thickness of about 20Å. A free layer 2 whose magnetic orientation is rotated by the magnetic field previously input is disposed thereon. A cap layer 1 is disposed is disposed on free layer 2 to prevent oxidization of the free layer. The end portions of the magnetoresistive stack, which comprises layers 1, 2, 3, 4 and 5, are shaved off, for example, by ion milling, so that the magnetoresistive stack is trapezium-shaped.

At both end portions of the stack, a magnetic film 16 is disposed with an underlying seed layer 17 between the magnetic film and the stack, and a magnetic film 14 is further disposed with another non-magnetic film 15 between the two magnetic films. The magnetic orientation of magnetic film 14 is fixed in one direction by an anti-ferromagnetic film 13. It is, however, noted that this anti-ferromagnetic film 13 may be eliminated, for example, by proper selection of the material and thickness of the magnetic film and the non-magnetic film which is disposed between magnetic films to meet conditions of magnetization and other factors. The lead 10 is disposed on a second seed layer 11 overlying the anti-ferromagnetic film. This seed layer 11 may be eliminated. A lamination stack M1 consisting of layers 13–17 carries out magnetic domain control of free layer 2.

It is preferable that magnetic films 14 and 16 contain Fe or Ni, and are soft magnetic films. Magnetic films 16 and 14 are anti-ferromagnetically coupled through non-magnetic film 15. In order to couple magnetization of magnetic films 14 and 16 in an anti-parallel manner as shown by the white arrows in the figure, it is preferable that non-magnetic film 15 is one material or an alloy of materials selected from the group Ru, Cr, Ir, Rh, Os, Re, Au, Ag, Cu and that the thickness of this non-magnetic film is less than 10Å.

Magnetic film 14 may finally be magnetized in the opposite direction to the magnetic domain controlling magnetic field and magnetization may be aligned to this direction by anti-ferromagnetic film 13, in which case magnetic film 16 close to the magnetoresistive stack is controlled by anti-ferromagnetic coupling so that magnetic domain control becomes possible. In addition, if it is desired that free layer 2 have a right-sided magnetic orientation, as shown by the lower white arrow in the figure, the difference of magnetization in magnetic films 14 and 16, which are anti-parallel, can be made to go to the right side by using a thick material for magnetic film 16 that has a stronger magnetic field for magnetic domain control than magnetic film 14, or by making the film thickness magnetic film 16 greater than that magnetic film 14 if the same material is used for both magnetic films 14 and 16.

Since magnetic film 16 is a soft magnetic film which contains Fe or Ni, there is an advantage that magnetic orientation at the end portion of the free layer is easy to rotate and the sensitivity of the MR head is increased as compared to the related art magnetic domain controlling method comprising only a ferromagnetic film.

Further, when controlling is carried out by changing the thickness of a non-magnetic film in such a manner that anti-ferromagnetic coupling force is maintained but weakened, the magnetic orientation of magnetic films 14 and 16 is made to move around in such a manner that it absorbs magnetic fluxes from multiple directions, and therefore, it becomes possible that magnetic films 14 and 16 function as side shields. Thus, it is possible to prevent flow of extra fluxes into the free layer from end portions of a track or adjacent tracks in the recording state, which is unstable, and so this is advantageous in making a track narrower.

Further, when an anti-ferromagnetic coupling force is strengthened by making a lamination of magnetic films 16 and 14 with non-magnetic film 15 between them, as in this embodiment, the magnetic domain controlling film M1 is stabilized and is less easily influenced by heat.

Figure 2:
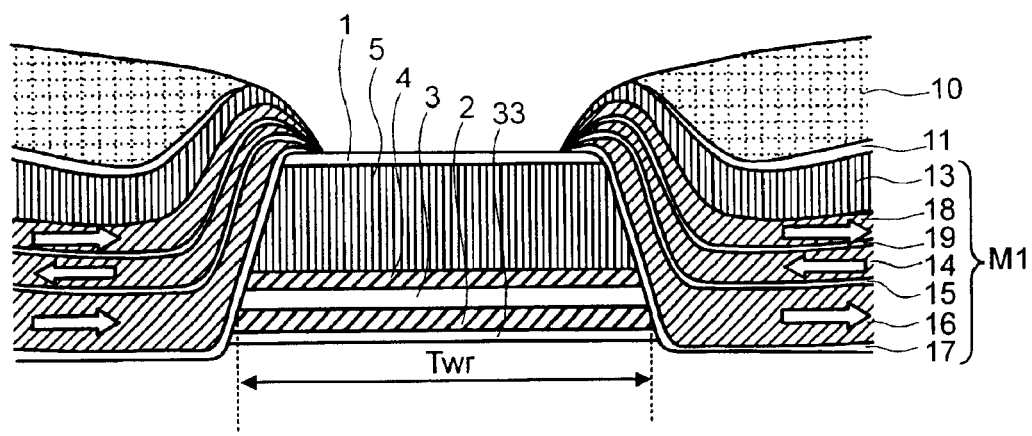
FIG. 2 is a cross-sectional view of a GMR magnetoresistive element according to a second embodiment of the invention.

FIG. 2 shows a cross-sectional view of a GMR element according to the invention. Free layer 2, whose magnetic orientation is rotated by the previously input magnetic field, is disposed on a seed layer 33. A non-magnetic layer 3 made of Cu, for example, is disposed on free layer 2, and has a thickness of about 20Å. Pinned layer 4, whose magnetic orientation is fixed by the anti-ferromagnetic body 5, is disposed on non-magnetic layer 3. Cap film 1 is disposed on pinned layer 4 to for prevent oxidization. End portions of a magnetoresistive stack of 1, 2, 3, 4, 5 and 33 are shaved off, for example, by ion milling so that the magnetoresistive stack is trapezoid-shaped.

At both end portions of the stack, which comprises 1–5 and 33, magnetic film 16 is disposed with an underlying seed layer 17 between the film and the stack, and magnetic film 14 is disposed on non-magnetic film 15 layered between magnetic films 14 and 16. A non-magnetic film 19 is disposed on magnetic film 14, and a magnetic film 18 is further disposed on non-magnetic film 19. An anti-ferromagnetic film 13 for fixing magnetic orientation of the magnetic film 18 in one direction is disposed on magnetic film 18. It is, however, noted that this anti-ferromagnetic film 13 may be eliminated, for example, by properly selecting the material and thickness of the magnetic film and the non-magnetic film which is disposed between magnetic films to meet the conditions of magnetization. The lamination stack M1 of 13–19 carries out magnetic domain control of the free layer 2.

It is preferable that magnetic films 14, 16 and 18 contain Fe or Ni, and are soft magnetic films. Magnetic films 16 and 14 and magnetic films 14 and 18 are anti-ferromagnetically coupled through the non-magnetic films 15 and 19, respectively. To couple magnetic films 14 and 16 and magnetic films 14 and 18 in an anti-parallel manner as shown by the white arrows in the figure, it is preferable that each of non-magnetic films 15 and 19 is an alloy of one or more materials selected from the group of Ru, Cr, Ir, Rh, Os, Re, Au, Ag, Cu, and that the thickness of these non-magnetic films is less than 10Å.

When magnetic film 18 is finally magnetized in the same direction as the magnetic domain controlling magnetic field is applied or magnetization is aligned in this direction by anti-ferromagnetic film 13, magnetic film 14 is coupled in anti-parallel thereto. Then, magnetic film 16 nearest to the magnetoresistive stack is coupled in anti-parallel manner and controlled by the magnetic domain control so that magnetic domain control of free layer 2 becomes possible. In addition, in this embodiment, the MR head is constructed such that the anti-ferromagnetic body for aligning magnetic orientation of the pinned layer is disposed on the free layer in the magnetoresistive stack, but similar advantages may be obtained even when the structure of the invention is applied to an MR head constructed such that the anti-ferromagnetic body for fixing magnetic orientation of the pinned layer is disposed under the free layer in the magnetoresistive stack.

Further, when the total film thickness of this embodiment and that of embodiment 1 are the same, the laminated stack of the magnetic films alternating with the non-magnetic films in this embodiment has more layers than embodiment 1, so that the film thickness of each magnetic film layer is reduced, and since anti-ferromagnetic intensity increases in reverse proportion to film thickness, coupling force in the lamination is strengthened and stabilized. As a result, the advantage that the laminated stack of the second embodiment is less easily influenced by heat is also obtained.

On the other hand, even when more magnetic films are laminated with non-magnetic films in this embodiment than is done in embodiment 1, and film thickness is increased by just the thickness of magnetic film 18, compared to the composition of embodiment 1, the quality of the magnetic film as a side shield can be improved.

Figure 3:
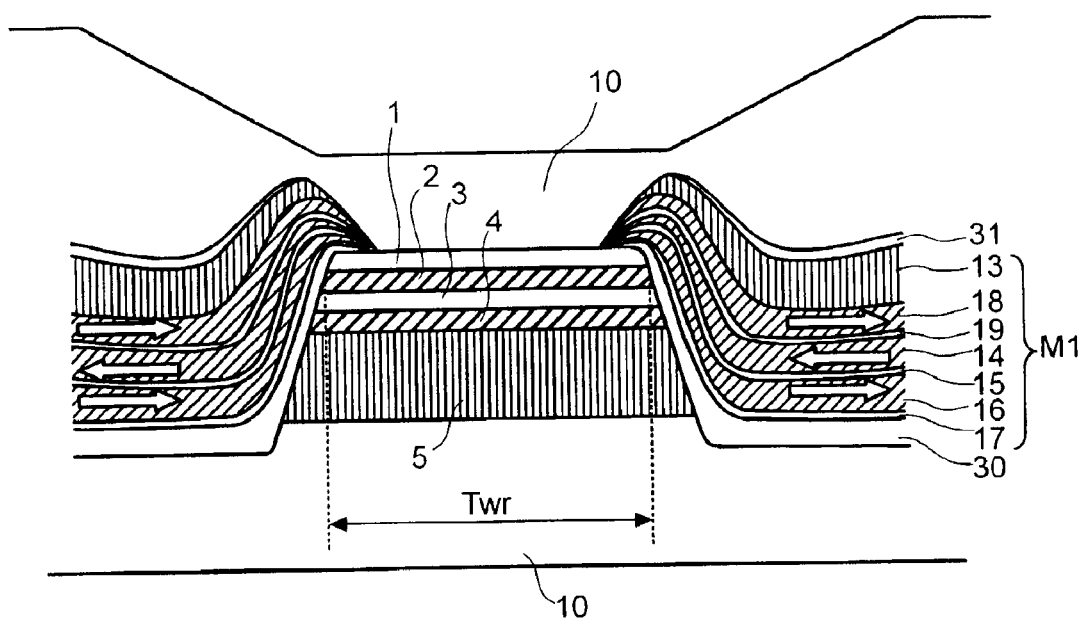
FIG. 3 is a cross-sectional view of a CPP-GMR magnetoresistive element from the side according to a third embodiment of the invention.

FIG. 3 shows a cross-sectional view of a CPP-GMR element according to the invention. Layers 1, 2, 3, 4, 5, 13, 14, 15, 16 and 17 shown in FIG. 3 are the same as in the structure of the embodiment 1 shown in FIG. 1. Further, the leads 10 are disposed so as to sandwich the stack which comprises 1, 2, 3, 4 and 5.

At both end portions of the stack which comprises 1–5, an insulating layer 30 is disposed, with seed layer 17 overlying the insulating layer, and magnetic layers 16 and 14 are disposed with non-magnetic film 15 between them. Non-magnetic film 19 is disposed on magnetic film 14, and magnetic film 18 is imposed on non-magnetic film 19. An anti-ferromagnetic film 13 for fixing the magnetic orientation of the magnetic film 18 in one direction is disposed on magnetic film 18. It is, however, noted that this anti-ferromagnetic film 13 may be eliminated, for example, by properly selecting the material and thickness of the magnetic film and the non-magnetic film which is disposed between magnetic films to meet the conditions of magnetization. The lamination stack M1 of 13–19 carries out magnetic domain control of free layer 2. Further, an insulating layer 31 is built up on lamination stack M1. This insulating layer 31 may be eliminated.

It is preferable that magnetic films 14, 16 and 18 are soft magnetic films which contain Fe or Ni. Magnetic films 16 and 14 and magnetic films 14 and 18 are anti-ferromagnetically coupled through non-magnetic films 15 and 19, respectively. In order to couple the magnetization of magnetic films 14 and 16 and magnetic films 14 and 18 in an anti-parallel manner as shown by the white arrows in the figure, it is preferable that each of non-magnetic films 15 and 19 is one material or an alloy of materials selected from the group of Ru, Cr, Ir, Rh, Os, Re, Au, Ag, Cu and that the thickness of these non-magnetic films is less than 10Å.

When magnetic film 18 is finally magnetized in the same direction as the magnetic domain controlling magnetic field is applied, and magnetization in this direction has been achieved by the anti-ferromagnetic film 13, magnetic film 14 is coupled to magnetic film 18 in anti-parallel manner. Further, magnetic film 16, which is nearest to the magnetoresistive stack, is coupled in anti-parallel manner and its magnetic domains are controlled so that magnetic domain control of free layer 2 becomes possible even in CCP-GMR.

Figure 4:
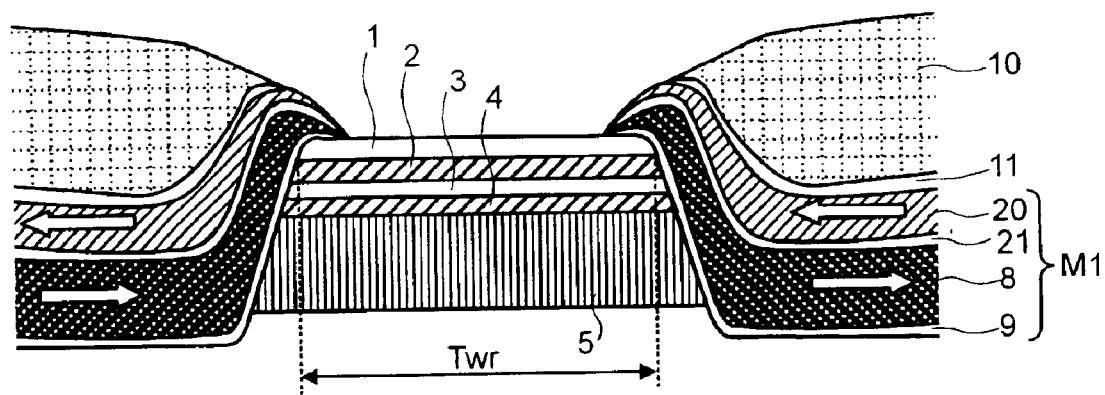
FIG. 4 is a cross-sectional view of a GMR magnetoresistive element according to a fourth embodiment of the invention.

FIG. 4 shows a cross-sectional view of a GMR element according to the invention. Layers 1, 2, 3, 4, 5, 10 and 11 shown in FIG. 4 are the same as in the structure of the embodiment 1 shown in FIG. 1.

At both end portions of the stack, which comprises 1–5, a magnetic film 8 is disposed with a seed layer 9 between the magnetic film and the stack, and a magnetic film 20 is further disposed with a non-magnetic film 21 between magnetic films 8 and 20. Lead 10 is disposed on seed layer 11, which is disposed on magnetic film 20. The seed layer 11 may be eliminated. The lamination stack M1, which comprises 8, 9, 20 and 21, carries out magnetic domain control of free layer 2.

It is preferable that magnetic film 8 is a ferromagnetic film which is a CoPt alloy wherein the atomic percentage of Pt is 4–30%, or a CoCrPt alloy or CoCrPt—ZrO2 or CoCrPt—SiO2 wherein the atomic percentage of Cr is 2–15%. Further, it is preferable that the magnetic film is a soft magnetic film which contains Fe or Ni. Magnetic films 8 and 20 are coupled anti-ferromagnetically through non-magnetic film 21. In order to couple magnetic films 8 and 20 in an anti-parallel manner as shown by the white arrows in the figure, it is preferable that non-magnetic film 21 is one material or an alloy of materials selected from the group of Ru, Cr, Ir, Rh, Os, Re, Au, Ag, Cu and that the thickness of this non-magnetic film is less than 10Å.

When the soft magnetic film is overlaid on the magnetoresistive stack, there is a drawback that, since magnetic field generated from the overlaid portion goes in the opposite direction to that of the magnetic field for magnetic domain control, the magnetic field for magnetic domain control at the end portions of the free layer is reduced. When magnetic film 20 is deposited to be anti-ferromagnetically coupled with magnetic film 8 through nonmagnetic film 21 and the respective directions of the magnetic fields for magnetic domain control in magnetic films 8 and 20 are made in anti-parallel, the extra magnetic fluxes at the overlaid portion of magnetic film 8 are sent back to magnetic film 20 so that the problem can be solved.

Further, if anti-ferromagnetic coupling intensity is weakened by varying the thickness of the non-magnetic film to the extent that the anti-parallel state of magnetization in both sides is not broken up, the magnetic permeability in the vertical direction of the element can be secured and magnetic film 20 can be used as a side shield.

In addition, the same advantages can be also obtained when this embodiment is applied to CPP-GMR and TMR heads.

Figure 5:
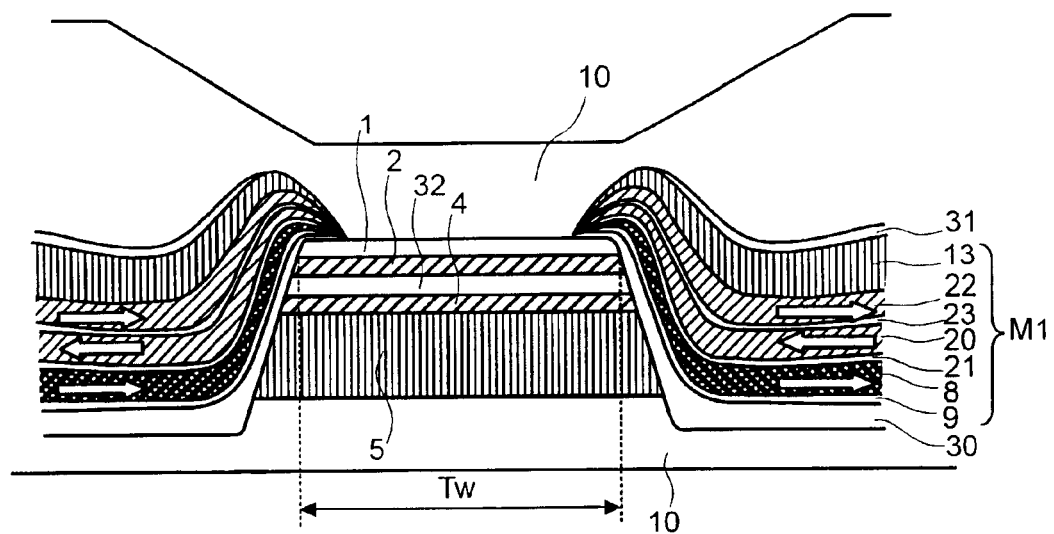
FIG. 5 is a cross-sectional view of a TMR magnetoresistive element according to a fifth embodiment of the invention.

FIG. 5 shows a cross-sectional view of a TMR element according to the invention. The layers with corresponding numbers shown in FIG. 5, are the same as in the structure of the embodiment 1 shown in FIG. 1. In this embodiment, instead of the non-magnetic layer 3 shown in FIG. 1, an insulator 32 is disposed on the pinned layer 4, and on the insulator 32, is disposed free layer 2, whose magnetic orientation is rotated by the previously input magnetic field. Further, the leads 10 are disposed so as to sandwich the stack which comprises 1, 2, 32, 4 and 5.

At both end portions of the stack, an insulator 30 is disposed, and magnetic film 8 is disposed with seed layer 9 between the magnetic film and the stack. Non-magnetic film 21 is then disposed between magnetic film 8 and magnetic film 20. A magnetic film 22 is further disposed with a non-magnetic film 23 between magnetic film 20 and magnetic film 22. Anti-ferromagnetic film 13 is disposed ton magnetic film 22, and magnetic orientation control of this magnetic film is carried out, but anti-ferromagnetic film 13 may be eliminated, for example, by properly selecting the material and thickness of the magnetic film and the non-magnetic film which is disposed between magnetic films to meet the conditions of magnetization. The lamination stack M1, which comprises 8, 9, 13 and 20–23. carries out magnetic domain control of free layer 2. Further, insulator 31 is built up on lamination stack M1. This insulator 31 may be eliminated.

It is preferable that magnetic film 8 is a CoPt alloy wherein the atomic percentage of Pt is 4–30% or a CoCrPt alloy or CoCrPt—ZrO2 or CoCrPt—SiO2 wherein the atomic percentage of Cr is 2–15%. Further, it is preferable that magnetic films 20 and 22 are soft magnetic films which contain Fe or Ni. Magnetic films 8 and 20 and magnetic films 20 and 22 are coupled anti-ferromagnetically through non-magnetic films 21 and 23, respectively. To couple the magnetic films in an anti-parallel manner as shown by the white arrows in the figure, it is preferable that each of nonmagnetic films 21 and 23 is one material or an alloy of materials selected from the group of Ru, Cr, Ir, Rh, Os, Re, Au, Ag, Cu and that the thickness of these non-magnetic films is less than 10Å.

When the magnetic film is finally magnetized in the same direction as the magnetic field for magnetic domain control is applied and magnetization is aligned in this direction by anti-ferromagnetic film 13, magnetic film 20 is coupled in anti-parallel to the coupled magnetic films, and, further, if the magnetic film nearest to the magnetoresistive stack is coupled in an anti-parallel manner and magnetic domain control is carried out, magnetic domain control of free layer 2 becomes possible even with a TMR element.

In addition, when the total film thickness of the magnetic films in this embodiment and the embodiment 4 are the same, the film thickness of each magnetic film layer is reduced, since there are more magnetic films laminated with non-magnetic films in this embodiment, and since anti-ferromagnetic intensity is increased in reverse proportion to film thickness, coupling force in the lamination is strengthened and stabilized. As a result, this embodiment has the further advantage that it is less easily influenced by heat.

On the other hand, even when, as in this embodiment, more magnetic films are laminated with the non-magnetic films as compared to embodiment 4, and the film thickness is increased by just the thickness of magnetic film 22 as compared to the structure of embodiment 4, the function of the magnetic film as a side shield can be improved. These advantages can be obtained in a similar manner even when the structure of this embodiment is applied to GMR and CPP-GMR, not only to TMR.

Figure 6:
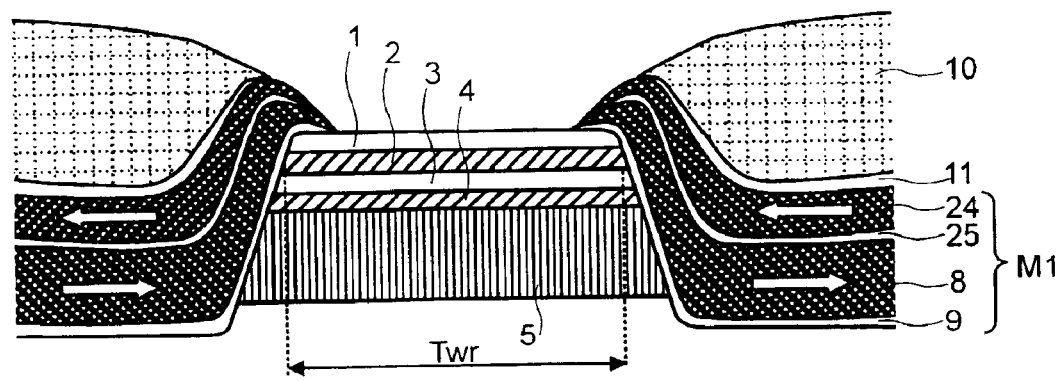
FIG. 6 is a cross-sectional view of a GMR magnetoresistive element according to a sixth embodiment of the invention.

FIG. 6 is a cross-sectional view of a GMR element according to the invention. Layers 1, 2, 3, 4, 5, 10 and 11 shown in FIG. 6 are the same as in the structure of the embodiment 1 shown in FIG. 1.

At both end portions of the stack which comprises 1–5, magnetic film 8 is disposed with seed layer 9 between the magnetic film and the stack, and a magnetic film 24 is further disposed with a non-magnetic film 25 between magnetic film 8 and magnetic film 24. Lead 10 is disposed with seed layer 11 between magnetic layer 24 and the lead. This seed layer 11 may be eliminated.

The lamination stack M1 of 8, 9, 24 and 25 carries out magnetic domain control of free layer 2. When this embodiment is used with CPP-GMR and TMR, an insulating film, which is made, for example, of aluminum, is disposed between M1 and the magnetoresistive stack, and the leads 10 are disposed on and under M1 in contact with the magnetoresistive stack.

It is preferable that magnetic film 8 is a CoPt alloy wherein the atomic percentage of Pt is 4–30%, or a CoCrPt alloy or CoCrPt—ZrO2 or CoCrPt—SiO2 wherein the atomic percentage of Cr is 2–15%. Since magnetic films 8 and 25 are ferromagnetic, as compared to a case where the magnetic film is a soft magnetic film, magnetic orientation is stabilized and magnetic domain control of the free layer may be carried out by a strong magnetic field.

Further, magnetic films 8 and 24 are coupled anti-ferromagnetically through nonmagnetic film 25. In order to couple magnetization of magnetic films 8 and 24 in an anti-parallel manner as shown by the white arrows in the figure, it is preferable that nonmagnetic film 25 is one material or an alloy of materials selected from the group of Ru, Cr, Ir, Rh, Os, Re, Au, Ag, Cu and that the thickness of this nonmagnetic film 25 is less than 10Å.

Normally, when magnetic film having hard magnetism is overlaid on a magnetoresistive stack, there occurs a drawback that the magnetic field for magnetic domain control at end portions of the free layer is reduced, because magnetic fluxes generated from the overlaid portion are magnetized in a direction opposite to that of the magnetic field for magnetic domain control. When magnetic film 24 is anti-ferromagnetically laminated on magnetic film 8 through non-magnetic film 25, and the directions to which the respective magnetic fields for magnetic domain control of the magnetic films 8 and 24 are applied are made in anti-parallel, the extra magnetic fluxes at the overlaid portion of magnetic film 8 are sent back to magnetic film 24 so that the problem can be solved.

In this embodiment, the magnetic domain controlling force from the macroscopic viewpoint becomes the difference of thickness of magnetic film chemical deposits of magnetic films 8 and 24. In addition, when the total film thickness of magnetic films 8 and 24 is too great, the distance between magnetic shields is broadened and high resolution is not obtained. In such a case, it is necessary to reduce the total film thickness while maintaining the magnetic domain controlling force by appropriately changing the material that is used for the respective magnetic films.

Figure 9:
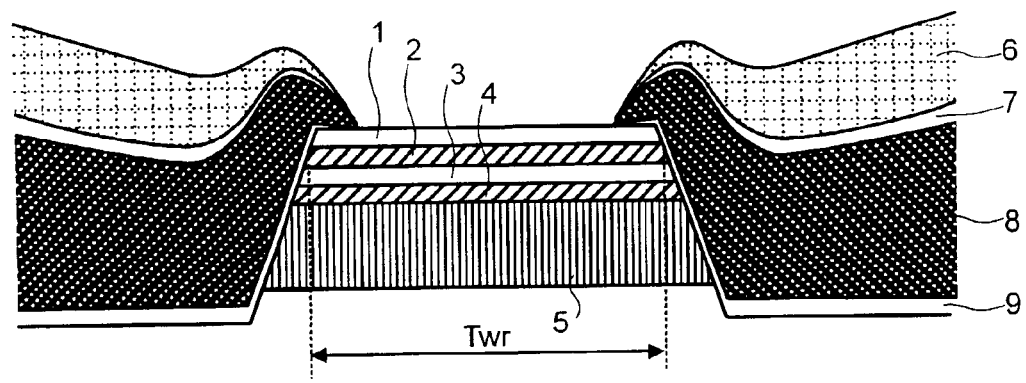
FIG. 9 is a cross-sectional view of a GMR magnetoresistive element to which magnetic domain controlling method using an anti-ferromagnetic film of related art is applied.

In the case presented in this embodiment and in the related art shown in FIG. 9, the same material is used as the magnetic material, and total thickness of the magnetic film is the same, and the magnetic domain controlling force is the same. The magnetic field is increased in the structure of this embodiment since rippling at the end portions of the free layer is reduced so that stability of the output of the magnetoresistive head is increased. Further, since magnetic field gradient is also increased and the magnetic field for magnetic domain control in the free layer is reduced, the sensitivity of the magnetoresistive head is increased. Because the magnetic films are coupled anti-ferromagnetically through non-magnetic films, this lamination stack M1 is stable.

In addition, in the case of a related art magnetic domain controlling system in which magnetic domain control is carried out by one layer of the ferromagnetic film, as film thickness is reduced to increase sensitivity, film thickness at the straight portion[?] is not maintained near end portions since end portions of the magnetoresistive stack have a large angle because they have been shaved off, for example, by milling. As a result, a variation of magnetic domain controlling force occurs which causes increased instability. When the magnetic domain controlling force is derived from the difference between two layers with thick ferromagnetic films, it is possible to reduce the variation of the magnetic domain controlling force.

In addition, even when this embodiment is applied to CPP-GMR and TMR heads, similar advantages may be obtained.

Figure 13:
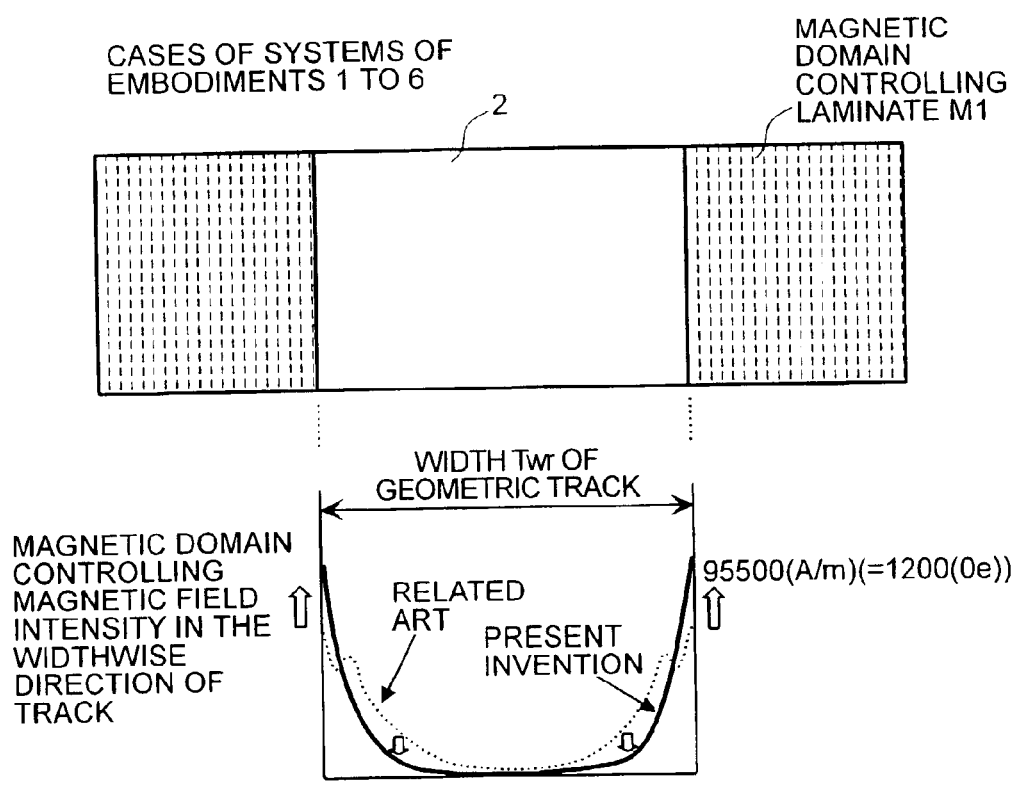
FIG. 13 is a view explaining an aspect in which magnetic field distribution for magnetic domain control is improved at a free layer position in a magnetic domain controlling structure of the invention.

FIG. 13 shows an aspect in which magnetic field distribution for magnetic domain control is improved at the free layer position of the magnetoresistive head to which lamination stack M1 of the magnetic domain controlling structure of embodiments 1-6 is applied. When rippling of the magnetic field at the end portions in the track width Twr direction of free layer 2 is reduced, the magnetic field is increased, and magnetic field intensity is greater than the magnetic field intensity of the related art 95500(Å/m) (=1200(Oe)) shown in FIG. 9, and the stability of the output of the magnetoresistive head is increased. Moreover, the magnetic field gradient is increased; the magnetic field for magnetic domain control in the free layer 2 is reduced; and, therefore, the sensitivity of the magnetoresistive head is increased. Since the ferromagnetic film and the magnetic film are anti-ferromagnetically coupled through the nonmagnetic film, this lamination stack M1 is very stable.

Figure 7:
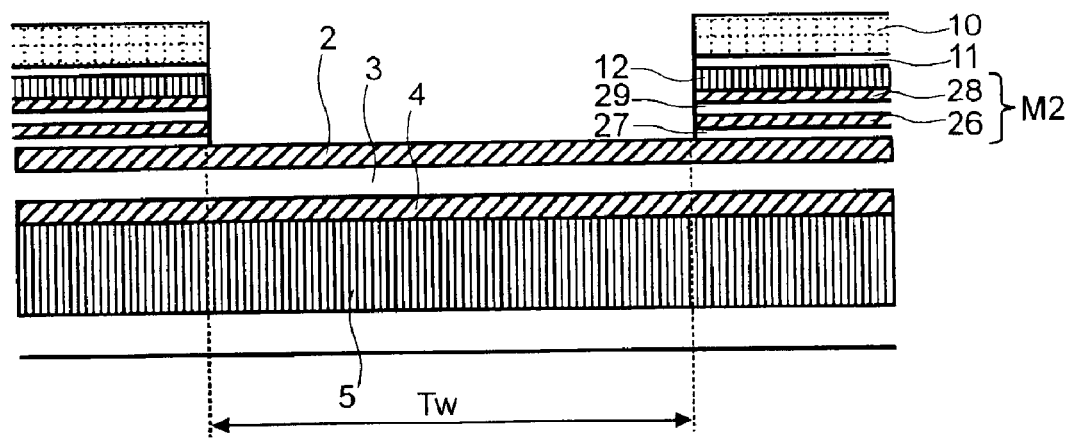
FIG. 7 is a cross-sectional view of a GMR magnetoresistive element to which magnetic domain controlling method using an anti-ferromagnetic film is applied according to a seventh embodiment of the invention.

FIG. 7 shows a cross-sectional view of a GMR element according to the invention. First, magnetic orientation of the pinned layer 4 is fixed by anti-ferromagnetic body 5. On this pinned layer 4, the nonmagnetic layer 3 is disposed and disposed thereon is the free layer 2 whose magnetic orientation is rotated by an input magnetic field. On the free layer 2, there is a lamination which comprises a magnetic film and a nonmagnetic film, and it is preferable that this lamination exist only at an area of particular length on track end portions of the free layer 2.

A nonmagnetic layer 27 is disposed on free layer 2. The lamination has a magnetic film 26 which is disposed on nonmagnetic layer 27 and a magnetic film 28 which is further disposed with a nonmagnetic film 29 between magnetic films 26 and 28. On magnetic film 28, an anti-ferromagnetic film 12 is deposed for fixing the magnetic orientation of magnetic film 28 in the same direction the free layer 2. The lamination from this nonmagnetic film 27 to anti-ferromagnetic film 12 is called lamination stack M2. It is, however, noted that this anti-ferromagnetic film 12 may be eliminated, for example, by properly selecting the material and the film thickness of a magnetic material and a nonmagnetic film which are disposed between magnetic films to meet the conditions of magnetization. A seed layer 11 is disposed on this lamination and the lead 10 is disposed thereon. Seed film 11 may be eliminated.

It is preferable that each of magnetic films 26 and 28 is a soft magnetic film which contains Fe or Ni. It is preferable that each of nonmagnetic films 27 and 29 is one material or an alloy of materials selected from the group of Ru, Cr, Ir, Rh, Os, Re, Au, Ag, Cu.

As a method for making this lamination, for example, on free layer 2, nonmagnetic film 27, magnetic film 26, nonmagnetic film 29, magnetic film 28, anti-ferromagnetic film 12, seed film 11 and lead 10 are laminated in sequence. The lead and laminates over the sensing region are removed by RIE (reactive ion etching), with nonmagnetic film 27 used as a stopper film. At this point, when nonmagnetic film 27 stays thinly on the sensing region, there are adverse effects on head characteristics.

Figure 10:
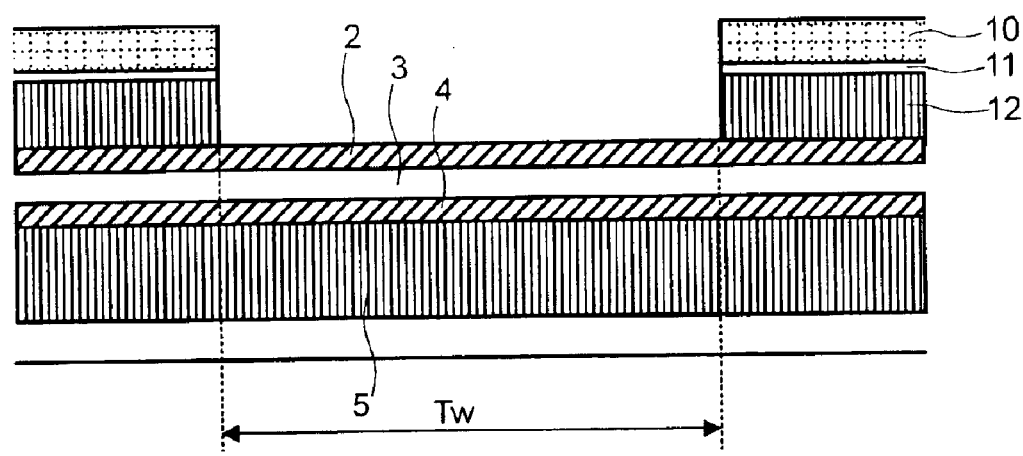
FIG. 10 is a cross-sectional view of a GMR magnetoresistive element to which a magnetic domain controlling method using an anti-ferromagnetic film of related art is applied.

In the case of a related art system in which magnetic domain control is carried out in magnetic film 8, as shown in FIG. 9, the magnetic field generated near the magnetic film 8 is very large and it prevents magnetic rotation of the free layer so that a wide dead zone is produced and the sensitivity of the element is reduced. Further, in the case of magnetic domain control using the anti-ferromagnetic film shown in FIG. 10, read drift occurs since exchange coupling between the anti-ferromagnetic film and the free layer is weak, and phenomena such as crosstalk and side-read occur, and noise worsens.

In contrast thereto, in the embodiment shown in FIG. 7, magnetization of both end portions of free layer 2 is fixed by anti-ferromagnetic coupling of magnetic layers 26 and 28 through nonmagnetic layers 27 and 29. This antiferromagnetic coupling is quite large compared with coupling of anti-ferromagnetic film 3 and free layer 2 in the related art, and therefore, no problem of read drift occurs. Further, since the ferromagnetic film is not primarily used, there is no case where magnetization rotation of end portions of free layer 2 is prevented.

Figure 14:
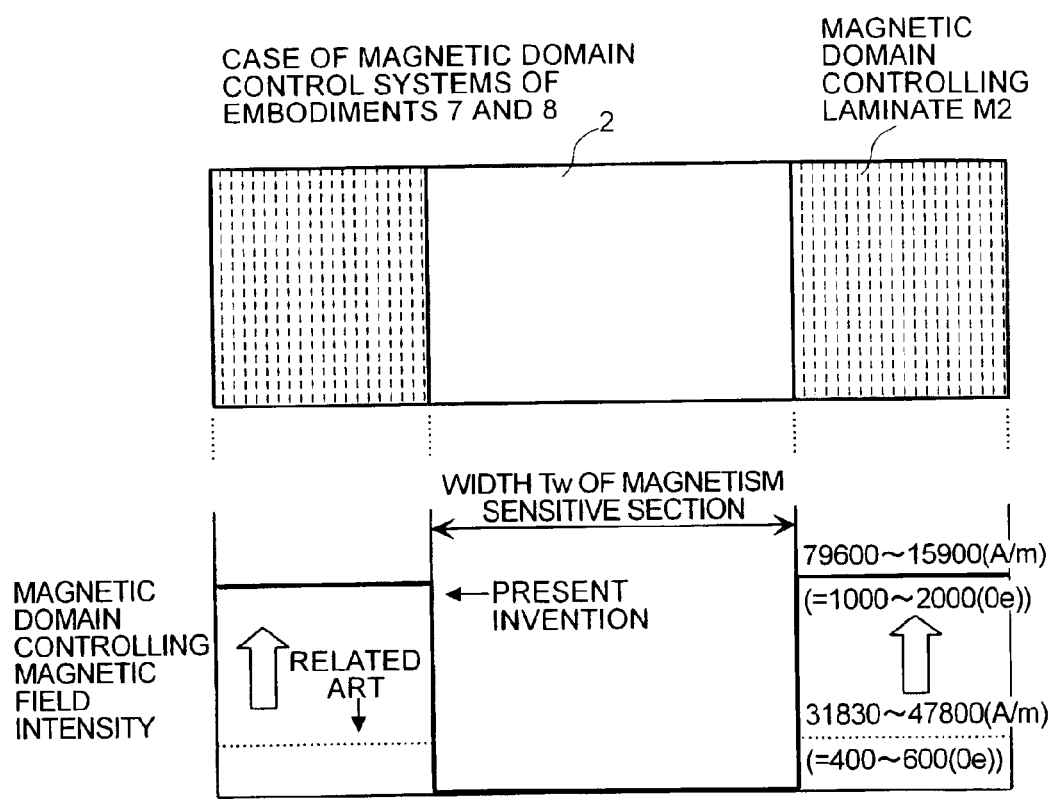
FIG. 14 is a view explaining an aspect in which magnetic field distribution for magnetic domain control is improved at the free layer position in a magnetic domain controlling structure of the invention.

FIG. 14 shows a magnetic field distribution for magnetic domain control. Since a magnetic field is not applied to the magnetic sensing region Tw of free layer 2, sensitivity is increased, and the controlling magnetic field generated from the lamination stack M2 at both end portions of the magnetic sensing region is 79600–15900(Å/m)(=1000–2000(Oe)) as compared with controlling magnetic field intensity 31830–47800(Å/m)(=400–600(Oe)) of the related art structure shown in FIG. 10 so that stability is improved.

Herewith, even in case of a GMR magnetoresistive element of a structure called patterned exchange, used is the lamination stack M2 in which magnetic layers are antiferromagnetically coupled with nonmagnetic layers between them, and magnetic domain control of the free layer 2 is carried out more strongly by anti-ferromagnetic coupling as compared with the related art, and thereby, it is possible to realize a magnetoresistive head which has little read drift and little noise while maintaining high sensitivity.

Figure 8:
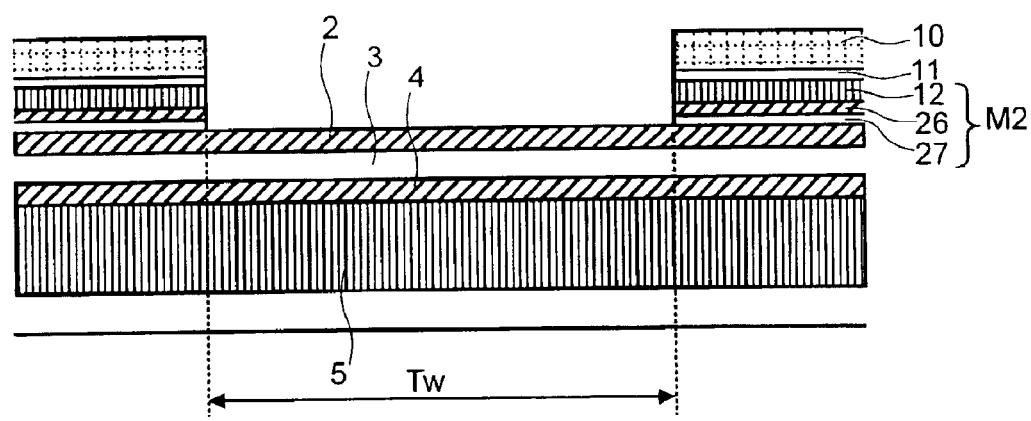
FIG. 8 is a cross-sectional view of a GMR magnetoresistive element to which magnetic domain controlling method using an anti-ferromagnetic film is applied according to a eighth embodiment of the invention.

FIG. 8 shows a cross-sectional view of a GMR magnetoresistive element according to the invention. Layers 2, 3, 4, 10, 11 and 26 shown in FIG. 8, are the same as in the structure of embodiment 7 shown in FIG. 7. In this embodiment, nonmagnetic film 27 is laminated to free layer 2, and magnetic film 26 is laminated on nonmagnetic film 27. On magnetic film 26, an anti-ferromagnetic film 12 is disposed for fixing the magnetic orientation of magnetic film 26 in the opposite direction to that of free layer 2. The lamination from nonmagnetic film 27 to anti-ferromagnetic film 12 is called lamination stack M2. It is, however, noted that anti-ferromagnetic film 12 may be eliminated, for example, by properly selecting the material and thickness of a magnetic film and a non-magnetic film which is disposed between magnetic films to meet the conditions of magnetization. A method for making this lamination stack M2 is similar to that described in embodiment 7.

It is preferable that magnetic film 26 is a soft magnetic film which contains Fe or Ni. It is preferable that nonmagnetic film 27 is one material or an alloy of materials selected from the group of Ru, Cr, Ir, Rh, Os, Re, Au, Ag, Cu.

With this embodiment, even when one magnetic film 26 is simply laminated over the free layer 2 in a GMR element of a structure called patterned exchange, it becomes possible for magnetic domain control of free layer 2 to be carried out by a large magnetic domain controlling magnetic field created by anti-ferromagnetic coupling.

Figure 11:
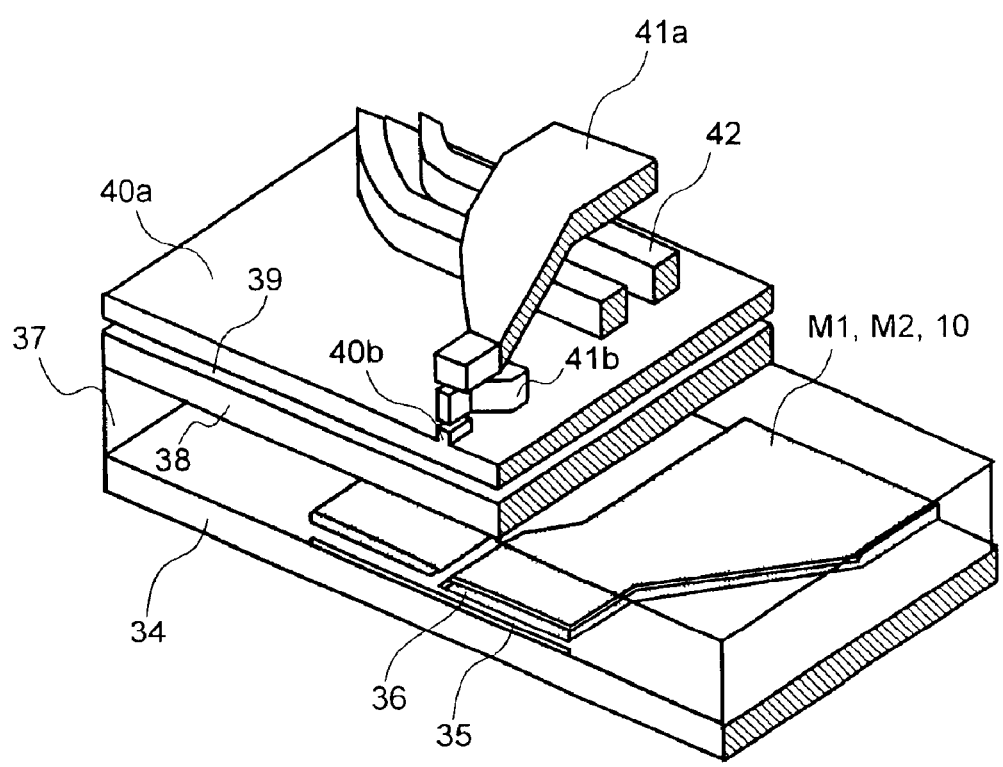
FIG. 11 is a view of a magnetic head in which a reproducing head having a magnetic domain controlling structure of the invention is incorporated.
Figure 12:
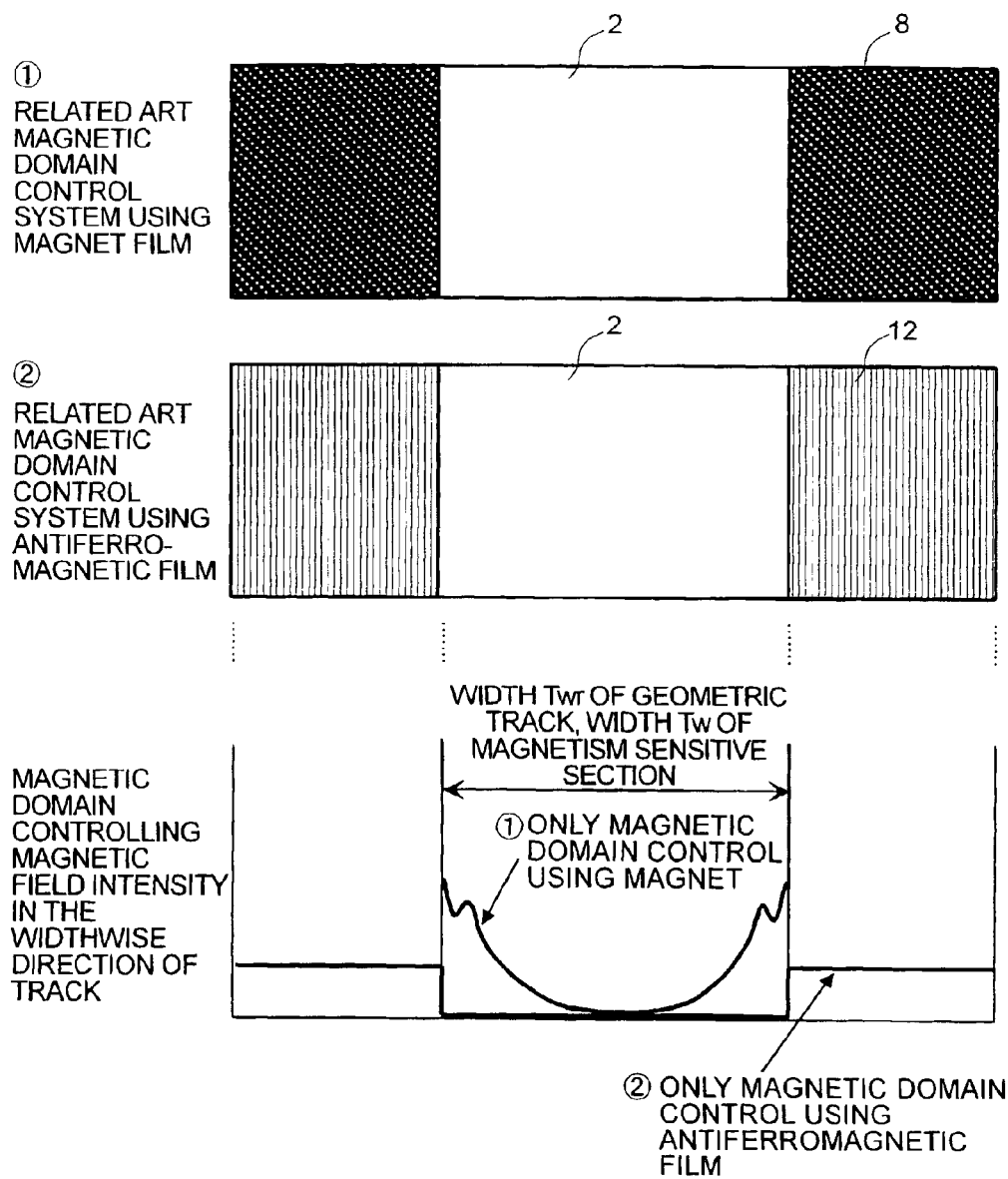
FIG. 12 is a schematic view of a magnetic domain controlling structure of related art from above, and a view showing magnetic field distribution for magnetic domain control at a respective free layer position.

FIG. 11 shows a full view of a magnetic head in which a reproducing head having a magnetic domain controlling structure of the invention is incorporated. There is a magnetoresistive stack 36 having magnetoresistive effect which is disposed on a lower shield 34 with an insulator 35 between them, and adjacent to both slanted end surfaces of the magnetoresistive stack is a lamination stack Ml; or further, on both end portions of the free layer which is a part of the magnetoresistive stack is a lamination stack M2. There is a lead 10 on lamination stack M1 or M2. On the lead 10, an upper shield 38 is disposed with an insulator 37 between them. On the upper shield 38, an insulator 39*a* is located and a pole 40*a* is disposed thereon. A part of the under-pole is a prong shaped structure 40b, and recording operation is carried out by this portion. Over the under-pole 40a, a coil 42 and upper-poles 41a, 41b are disposed. The tip portion of the upper-pole 41a is recessed away from the head surface, bent further toward the inner portion of the head than the tip of the upper-pole 41b. When the upper pole is divided, as into 41a and 41b here, magnetic fluxes generated in the magnetic pole by electric currents flowing in the coil 42 are collected effectively to the tip portion so that recording characteristics may be improved. This recording head may be one for use in perpendicular recording, which employs a main pole and a subpole.

In addition, when a magnetoresistive stack has a TMR effect or CPP-GMR effect, as stated above, it should be appreciated that insulators 35 and 37 may be leads and an insulator may enclose the lamination stack M1. Herewith, by using a reproducing head which has a magnetic domain controlling structure as stated above, it is possible to provide a magnetic head which has high sensitivity, little read drift, and good noise suppression.

Figure 15:
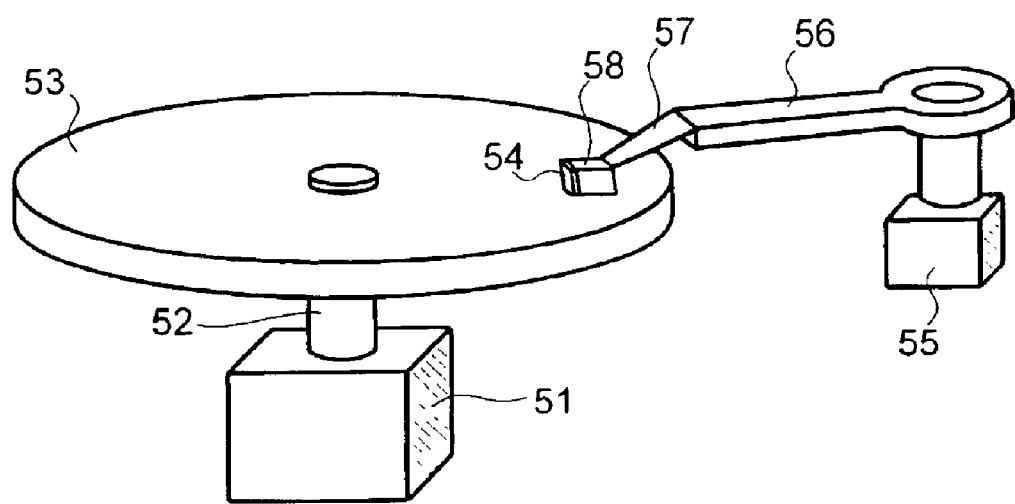
FIG. 15 is an full view of a magnetic disk apparatus in which a head having a magnetic domain controlling structure of the invention is incorporated.

FIG. 15 is an entire view of a magnetic disk apparatus in which a magnetic head having magnetic domain controlling structure of the invention is incorporated. A magnetic recording apparatus has a magnetic disk 53 for recording information which is mounted to a spindle 52 to be rotated by a spindle motor 51, and a suspension 57 is connected to a rotary actuator arm 56 which is driven by a voice coil motor 55, and a slider 58 is held by suspension 57. Slider 58 is designed to be mounted in such a manner that a magnetic head 54 that reads and writes the magnetic data from tracks on the disk is moved toward a disk surface When the magnetic head of the invention is used in the magnetic disk apparatus, the dead zone is eliminated, and rippling of the magnetic field at the end portions of the free layer widthwise in the track is reduced. Thus it becomes possible that recording and reproducing of magnetic data on magnetic disk 53 may be carried out with high output power; a magnetic disk of narrow track width may be used, and a high-density magnetic recording may be realized. Particularly, in case where a soft magnetic film is used as a lamination layer for magnetic domain control of the free layer, crosstalk from adjacent tracks may be prevented by controlling the film thickness of the nonmagnetic film layer, and, therefore, high reliability of the magnetic disk apparatus may be realized at the same time.

By using a magnetic domain control system for the free layer of a magnetoresistive head as in the invention, a magnetoresistive head and a magnetic head are produced which have higher sensitivity to narrow tracks compared to an element using a related art method, with the further advantages of high stability and good suppression of read drift and noise.

What is claimed is:

1. A magnetic bead comprising:
   a reproducing head provided between a first magnetic shield and a second magnetic shield, having a magnetoresistive stack which has a free layer whose magnetic direction is rotated by a previously input magnetic field, a pinned layer whose magnetic direction is fixed, and a non-magnetic layer provided between the free layer and the pinned layer, a lamination stack adjacent to the magnetoresistive stack, and a pair of leads for supplying electric currents to the magnetoresistive stack; and
   a recording head baying a first magnetic pole which is disposed adjacent to the second magnetic shield with a first insulator between said first magnetic pole and said second magnetic shield, and a second magnetic pole which is disposed adjacent to the first magnetic pole with a coil between said first and second magnetic poles,
   wherein said lamination stack includes an anti-ferromagnetic film, first and second soft magnetic films,
   wherein said first and second soft magnetic films are coupled anti-ferromagnetically through a non-magnetic film,
   wherein said first magnetic pole is divided into two parts.

2. A magnetic head according to claim 1, wherein said lamination stack is in contact with each layer of the magnetoresistive stack.

3. A magnetic head according to claim 1, wherein said lamination stack is disposed adjacent to the magnetoresistive stack with a second insulator in between said lamination stack and said magnetoresistive stack and said leads are disposed to sandwich the magnetoresistive stack between said leads.

4. A magnetic head according to claim 1, wherein said lamination stack further includes a third magnetic film.

5. A magnetic head according to claim 4, wherein electric current flows through said magnetoresistive stack and said lamination stack, and wherein said anti-ferromagnetic film is disposed closer to said pair of leads than said first soft magnetic film.

6. A magnetic head according to claim 1, wherein said first soft magnetic film is a CoPt alloy in which the atomic percentage of Pt is 4–30% or else a CoCrPt alloy or CoCrPt—SiO2 in which the atomic percentage of Cr is 2–15%.

7. A magnetic head according to claim 1, wherein said first and second soft magnetic films contain Fe or Ni, and wherein said anti-ferromagnetic film is placed closer to said pair of leads than said first soft magnetic film.

8. A magnetic head according to claim 1, wherein said non-magnetic film is one material or an alloy of materials selected from the group of Ru, Cr, Ir, Rh, Os, Re, Au, Ag, Cu.

9. A magnetic head comprising:
   a reproducing head provided between a first magnetic shield and a second magnetic shield, having a magnetoresistive stack which has a free layer whose magnetic direction is rotated by a previously input magnetic field, a pinned layer whose magnetic direction is fixed, and an insulating layer provided between the free layer and the pinned layer, a lamination stack, disposed adjacent to the magnetoresistive stack through an insulating layer, and a pair of leads for supplying electric currents; and
   a recording head having a first magnetic pole which is disposed adjacent to the second magnetic shield with an insulator between said first magnetic pole and said second magnetic shield, and a second magnetic pole which is disposed adjacent to the first magnetic pole with a coil between said first and second magnetic poles,
   wherein said lamination stack includes an anti-ferromagnetic film, first and second soft magnetic films,
   wherein said first and second soft magnetic films are coupled anti-ferromagnetically through a non-magnetic film, wherein said pair of leads are coupled to said magnetoresistive stack through said lamination stack, wherein said first magnetic pole is divided into two parts.

10. A magnetic head comprising:

a reproducing head provided between a first magnetic shield and a second magnetic shield, having a magnetoresistive stack which has a free layer whose magnetic direction is rotated by a previously input magnetic field, a pinned layer whose magnetic direction is fixed, and nonmagnetic layer provided between the free layer and the pinned layer, a lamination stack, disposed on end portions of the free layer of the magnetoresistive stack, and a pair of leads for supplying electric currents to said magnetoresistive stack; and a recording head having a first magnetic pole which is disposed adjacent to the second magnetic shield with an insulator between said first magnetic pole and said second magnetic shield, and a second magnetic pole which is disposed adjacent to the first magnetic pole with a coil between said first and second magnetic poles, wherein said lamination stack includes a first magnetic film coupled with the free layer anti-ferromagnetically through a first non-magnetic film, wherein said first magnetic pole is divided into two parts.

11. A magnetic head according to claim 10, wherein said lamination stack further has a ferromagnetic film which is anti-ferromagnetically coupled to said first magnetic film through a second non-magnetic film.

12. A magnetic head according to claim 10, wherein said first magnetic film is a soft magnetic film which contains Fe or Ni.

* * * * *